(12) United States Patent
Hwang et al.

(10) Patent No.: US 10,971,843 B2
(45) Date of Patent: Apr. 6, 2021

(54) BGA SOCKET DEVICE FOR TESTING BGA IC

(71) Applicants: Dong Weon Hwang, Gyeonggi-do (KR); Logan Jae Hwang, Flower Mound, TX (US); Jae Baek Hwang, Seoul (KR)

(72) Inventors: Dong Weon Hwang, Gyeonggi-do (KR); Logan Jae Hwang, Flower Mound, TX (US); Jae Baek Hwang, Seoul (KR)

( * ) Notice: Subject to any disclaimer, the term of this patent is extended or adjusted under 35 U.S.C. 154(b) by 0 days.

(21) Appl. No.: 16/596,999

(22) Filed: Oct. 9, 2019

(65) Prior Publication Data
US 2020/0176910 A1 Jun. 4, 2020

(30) Foreign Application Priority Data
Dec. 4, 2018 (KR) .................. 10-2018-0154687

(51) Int. Cl.
*H01R 13/15* (2006.01)
*H01R 13/193* (2006.01)
(Continued)

(52) U.S. Cl.
CPC ......... *H01R 13/193* (2013.01); *G01R 1/0483* (2013.01); *G01R 31/2886* (2013.01);
(Continued)

(58) Field of Classification Search
CPC .. H01R 13/502; H01R 13/629; H01R 13/193; H01R 13/15; H01R 2201/20; G01R 31/2886; G01R 1/0483
(Continued)

(56) References Cited

U.S. PATENT DOCUMENTS 6,280,219 B1 * 8/2001 Sano .................... H01R 13/193
439/268
6,296,505 B1 * 10/2001 Fukunaga ............ H05K 7/1007
439/268
(Continued)

FOREIGN PATENT DOCUMENTS

KR 1020010021425 A 3/2001
KR 1020010046510 A 6/2001
(Continued)

*Primary Examiner* — Abdullah A Riyami
*Assistant Examiner* — Vladimir Imas
(74) *Attorney, Agent, or Firm* — Levenfeld Pearlstein, LLC

(57) ABSTRACT

Disclosed is a BGA socket device used for testing a BGA IC and having a dual pinch type contact. The BGA socket device includes: contacts each including a fixed terminal and a movable terminal and configured such that respective upper ends of the fixed and movable terminals are offset from each other with respect to each solder ball of the IC; a main body in which the contact is provided and fixed; a cover supported on an upper surface of the main body and configured to be movable up and down; and a slider provided between the main body and the cover and configured to slide left and right, thus opening and closing the movable terminal in a horizontal direction, the slider having a fixed terminal receiving hole and a movable terminal receiving hole in which the fixed and movable terminals of the contact are received, respectively, by passing therethrough.

17 Claims, 30 Drawing Sheets

(51) Int. Cl.
  *G01R 1/04* (2006.01)
  *G01R 31/28* (2006.01)
  *H01R 13/502* (2006.01)
  *H01R 13/629* (2006.01)

(52) U.S. Cl.
  CPC ........... *H01R 13/15* (2013.01); *H01R 13/502* (2013.01); *H01R 13/629* (2013.01); *H01R 2201/20* (2013.01)

(58) Field of Classification Search
  USPC ........................................................ 439/260
  See application file for complete search history.

(56) References Cited

U.S. PATENT DOCUMENTS

| | | | | |
|---|---|---|---|---|
| 6,350,138 B1 * | 2/2002 | Atobe | ................. | H01R 13/193 439/266 |
| 7,318,736 B1 * | 1/2008 | Ambady | ............ | G01R 31/2863 439/259 |
| 8,272,882 B2 * | 9/2012 | Sakai | .................... | G01R 1/0466 439/268 |
| 2001/0002345 A1 * | 5/2001 | Ohshima | ............... | H01R 13/193 439/266 |
| 2003/0104717 A1 * | 6/2003 | Hayakawa | ........... | H01R 13/629 439/266 |
| 2006/0094280 A1 * | 5/2006 | Hayakawa | ........... | H05K 7/1084 439/331 |
| 2011/0171840 A1 * | 7/2011 | Sakai | .................... | G01R 1/0483 439/68 |

FOREIGN PATENT DOCUMENTS

| | | |
|---|---|---|
| KR | 2002291270000 A | 7/2001 |
| KR | 1020060083060 A | 7/2006 |
| KR | 1020130062060 A | 6/2013 |
| KR | 1020170055618 A | 5/2017 |
| TW | 200933989 A | 8/2009 |

* cited by examiner

BGA SOCKET DEVICE FOR TESTING BGA IC

CROSS REFERENCE TO RELATED APPLICATION

The present application claims priority to Korean Patent Application No. 10-2018-0154687, filed Dec. 4, 2018, the entire contents of which is incorporated herein for all purposes by this reference.

BACKGROUND OF THE INVENTION

Field of the Invention

The present invention relates to a BGA socket device used for testing a BGA IC and having a dual pinch type contact.

Description of the Related Art

In general, a socket for integrated circuits (hereinafter, referred to as an "IC") is mounted on a test board or a burn-in board. Such a socket is connected to measuring devices for measuring the properties of a burn-in chamber or peripheral devices and an IC, and is thus being used in a system for testing the IC. In this case, the burn-in chamber is used to input and output power and electric signals, which are required to drive the IC, through input/output (I/O) terminals provided on the board.

Among the ICs that have been widely used, a ball grid array (BGA) IC is defined as an IC in which conductive terminals, that is, solder balls, are uniformly arranged throughout a lower surface of the IC at regular intervals, thus remarkably reducing the size and thickness of the IC. FIGS. 1A and 1B are a plan view and a side view, respectively, illustrating a BGA IC 10, in which multiple solder balls 11 are provided on a lower surface of the IC 10.

FIG. 2 is a plan view illustrating a BGA socket device having pinch-type contacts according to the related art, FIG. 3 is a cross-sectional view taken along line A-A of FIG. 2, and FIG. 4 is a partially enlarged view of FIG. 3.

Referring to FIGS. 2 to 4, a BGA socket device according to the related art includes: contacts 16 each including a fixed terminal 20 and a movable terminal 20 that come into contact with each solder ball 2 of a BGA IC 1; a main body 17 accommodating bodies of the contacts 16; a stopper 18 provided on a lower surface of the main body 17 and supporting the contacts 16; a lead guide 19 guiding the positions of leads of the contacts 16; a cover 11 elastically supported on an upper surface of the main body 17 so as to be movable up and down within a predetermined stroke range with respect to the main body 17; a slider 15 provided on the upper surface of the main body 17 and configured to be movable left and right in cooperation with an up-and-down movement of the cover 11, thus opening and closing the movable terminal 20; multiple IC holders 14 rotatably assembled to the slider 15 and configured to press an upper surface of the IC 1 in cooperation with the up-and-down movement of the cover 11; and holder springs 14 provided in the slider 15 and elastically supporting the IC holders 14.

The contact 16 is configured such that the fixed terminal 20 and the movable terminal 21 are bilaterally symmetrically provided to come into contact with the solder ball 2 of the IC 1. The contact 16 has a contact body 24 in which lower end portions of the fixed terminal 20 and the movable terminal 21 are fixed, and a lead extending from the contact body 24. The lead 25 is soldered to a printed circuit board (PCB, not shown).

The cover 11 is elastically supported on the upper surface of the socket body 17 by springs 9 so as to be movable up and down within a predetermined distance and is provided with slider cams for operating the slider 15 left and right in accordance with an up-and-down position.

The slider 15 has a terminal hole 23 in which the two terminals 20 and 21 of the contact 16 that are vertically fixed to the contact body 17 are received by passing therethrough. Herein, the terminal hole 23 has a movable piece 22 provided to separate the fixed terminal 20 and the movable terminal 21 from each other.

Referring to FIG. 4, when the cover is pressed down, the slider 15 is moved right by the slider cams of the cover. Herein, the movable piece 22 is moved theretogether to open the movable terminal 21 outward, causing the solder ball 2 of the IC to be located between the fixed terminal 20 and the movable terminal 21. Meanwhile, the distance between the fixed terminal 20 and the movable terminal 21 separated with the movable piece 22 interposed therbetween at an initial position of the slider 15 is designed to be smaller than the size (diameter) of the solder ball. In FIG. 3, reference numeral 12 denotes an IC guide for guiding the IC's position when the IC 1 is loaded.

FIGS. 5A, 5B, and 5C are views illustrating a schematic operation example of the BGA socket device according to the related art.

FIG. 5A illustrates an initial state in which the cover 11 is elastically supported on the main body 17 and thus is located at a predetermined height, and the fixed terminal 20 and the movable terminal 21 of the contact are in close contact with the movable piece 22 and thus maintain a predetermined interval L1 between the two terminals 20 and 21.

Next, as illustrated in FIG. 5B, when the cover 11 is pressed and moved down, the movable piece 22 is moved to the right side of the figure together with the slider, causing the movable terminal 21 to be opened outward, whereby the IC 1 is loaded into the socket device. Herein, the distance L2 between the two terminals 20 and 21 is larger than the diameter of the solder ball 2.

Lastly, as illustrated in FIG. 5C, when the cover 11 is returned to an original position thereof, the movable piece 22 is returned to an initial position thereof together with the slider, causing the movable terminal 21 to be returned to an original position thereof, whereby the fixed terminal 20 and the movable terminal 21 grip the solder ball 2.

The above-described BGA socket device according to the related art has the following problems.

In a pinch-type contact, contact and release of the contact with/from the solder ball of the IC is made by horizontal operation of the movable terminal. Herein, the movable terminal may undergo repeated elastic deformation, leading to a decrease in contact force with the solder ball due to a decrease in durability due to repeated use. Particularly, in the BGA socket device according to the related art, returning of the slider to the initial position thereof in the process of returning the movable terminal (see FIG. 5C) is performed on the basis of a mechanism where an operating force is generated by an elastic restoring force of the movable terminal. Therefore, as the number of times of use of the movable terminal increases, the contact force with the solder ball may be decreased due to a gradual decrease in the elastic restoring force of the movable terminal due to the stress acting thereon, which may lead to lower the reliability in testing an IC.

Typically, a pinch-type BGA socket device is required to have a life span of about 20,000 cover cycles. Due to this, in the pinch-type contacts, preventing the elastic restoring force of the movable terminal from being decreased by improving the durability of the terminal during repeated use is crucial in determining the test reliability of the BGA socket device.

The foregoing is intended merely to aid in the understanding of the background of the present invention, and is not intended to mean that the present invention falls within the purview of the related art that is already known to those skilled in the art.

DOCUMENTS OF RELATED ART (Patent document 1) Korean Utility Model Registration No. 20-0229127 (published on Jul. 19, 2001)

SUMMARY OF THE INVENTION

Accordingly, the present invention has been made keeping in mind the above problems occurring in the related art, and an objective of the present invention is to provide a BGA socket device for testing a BGA IC, the BGA socket device being capable of preventing degrading of a pinch-type contact due to a decrease in elastic returning force of a terminal of the contact that comes into contact with a solder ball of the IC.

In order to achieve the above objective, according to one aspect of the present invention, there is provided a BGA socket device for testing a BGA IC, the BGA socket device including: contacts each including a fixed terminal and a movable terminal provided so as to face each other, the contact being configured such that respective upper ends of the fixed terminal and the movable terminal are offset from each other by a predetermined distance d with respect to each solder ball of the IC; a main body in which the contacts are vertically provided and fixed; a cover elastically supported on an upper surface of the main body and configured to be movable up and down within a predetermined height range relative to the main body; and a slider provided between the main body and the cover and configured to slide left and right in cooperation with an up-and-down movement of the cover, thus opening and closing the movable terminal in a horizontal direction, the slider having a fixed terminal receiving hole and a movable terminal receiving hole in which the fixed and movable terminals of the contact are received, respectively, by passing therethrough, wherein the fixed terminal receiving hole and the movable terminal receiving hole are offset from each other by a predetermined distance d equal to the distance d between the upper ends of the contact, and the fixed terminal receiving hole is longer in length than the movable terminal receiving hole.

According to another aspect of the present invention, there is provided a contact for a BGA socket device, the contact including: a fixed terminal and a movable terminal provided so as to face each other; a contact body to which lower ends of the fixed terminal and the movable terminal are integrally fixed; and a lead extending down from the contact body, wherein respective upper ends of the fixed terminal and the movable terminal are offset from each other by a predetermined distance with respect to each solder ball of an IC.

In the BGA socket device for testing the BGA IC according to the present invention, through provision of the dual pinch type contact that is configured such that the ends of two terminals thereof are offset from each other, and through provision of the slider that is configured to horizontally slide in a back and forth direction in cooperation with a vertical movement of the cover and thus to generate an operating force for opening and closing the contacts, a returning operation of the slider does not depend only on an elastic force of the contact itself unlike the related art and an operating force for directly sliding the slider in the back and forth direction is generated by the up-and-down movement of the cover. Therefore, it is possible to prevent degrading of the contact and to increase the test reliability, while prolong the life span of the socket device.

BRIEF DESCRIPTION OF THE DRAWINGS

The above and other objectives, features and other advantages of the present invention will be more clearly understood from the following detailed description when taken in conjunction with the accompanying drawings, in which.

DETAILED DESCRIPTION OF THE INVENTION

All terms or words used in the specification and claims have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Specific structural and functional descriptions of embodiments of the present invention disclosed herein are only for illustrative purposes of exemplary embodiments of the present invention, and the present description is not intended to represent all of the technical spirit of the present invention. On the contrary, the present invention is intended to cover not only the exemplary embodiments, but also various alternatives, modifications, equivalents and other embodiments that may be included within the spirit and scope of the present invention as defined by the appended claims.

Hereinbelow, exemplary embodiments of the present invention will be described in detail with reference to the accompanying drawings.

Figure 1A:
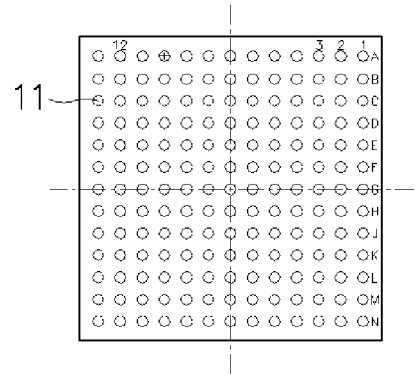
FIGS. 1A and 1B are a plan view and a side view, respectively, illustrating a BGA IC.
Figure 1B:
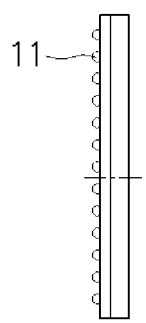
Figure 2:
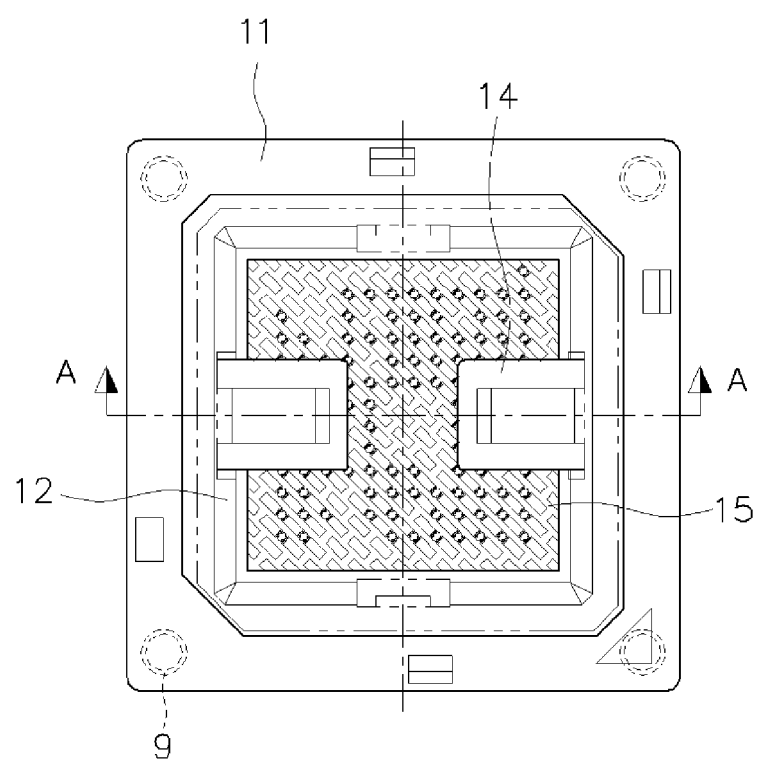
FIG. 2 is a plan view illustrating a socket device according to the related art.
Figure 3:
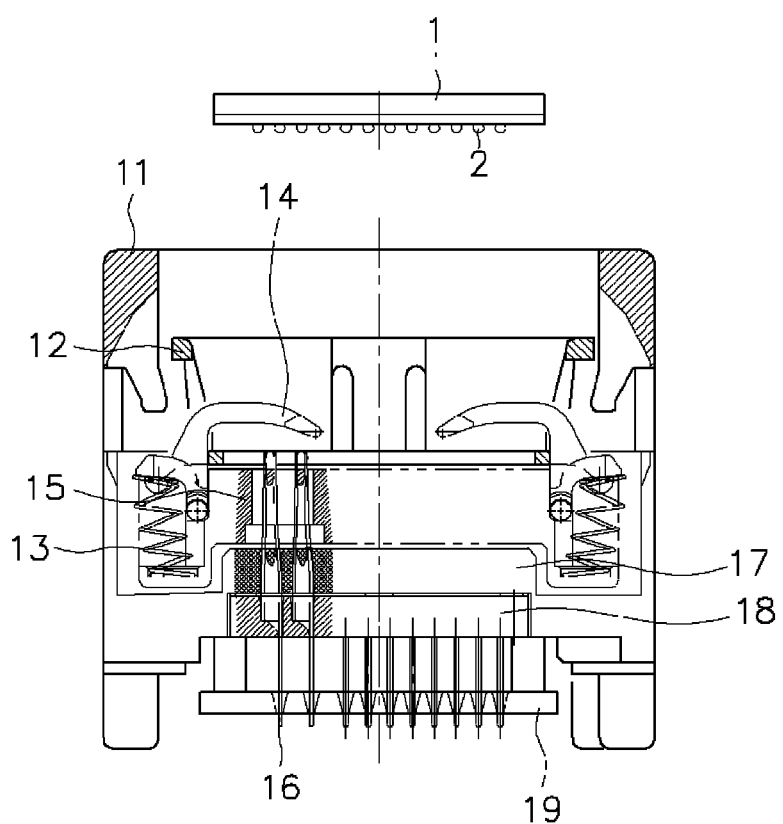
FIG. 3 is a cross-sectional view taken along line A-A in FIG. 2.
Figure 4:
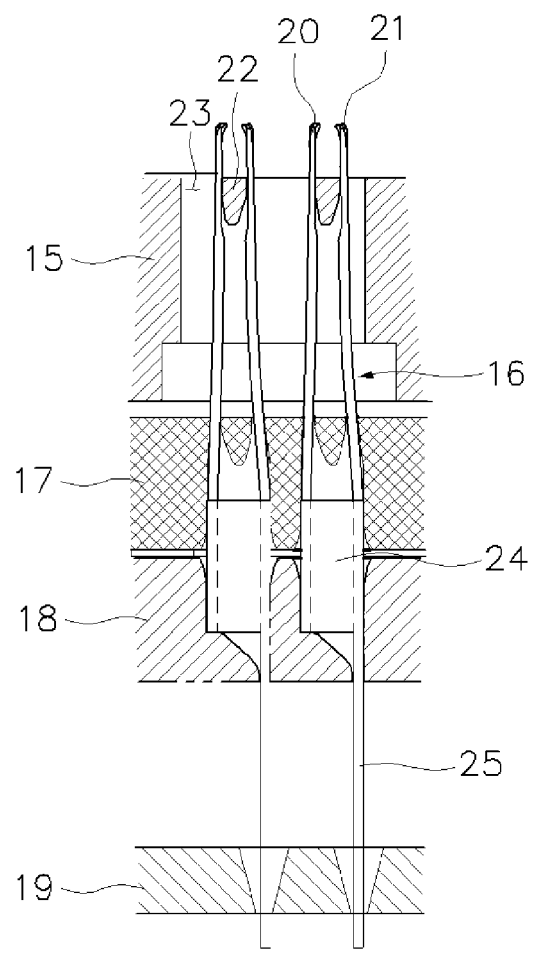
FIG. 4 is a partial enlarged view of FIG. 3.
Figure 5A:
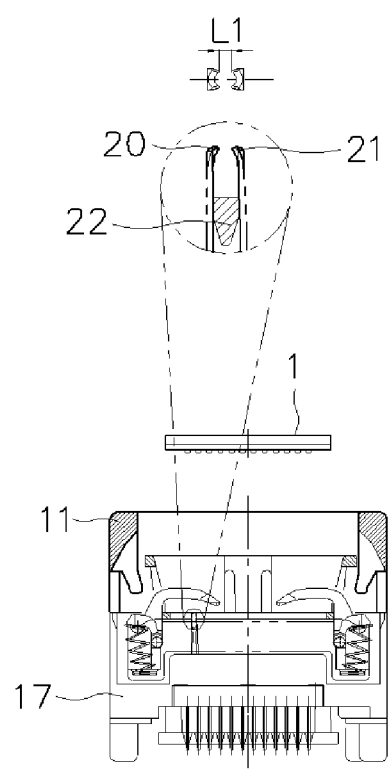
FIGS. 5A, 5B, and 5C are views illustrating a schematic operation example of the socket device according to the related art.
Figure 5B:
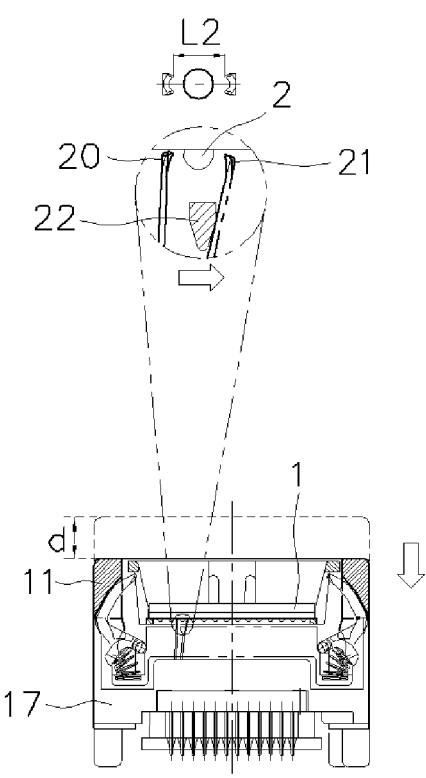
Figure 5C:
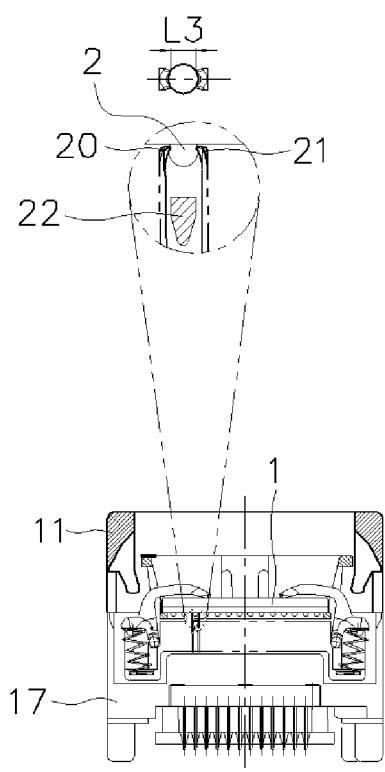
Figure 6:
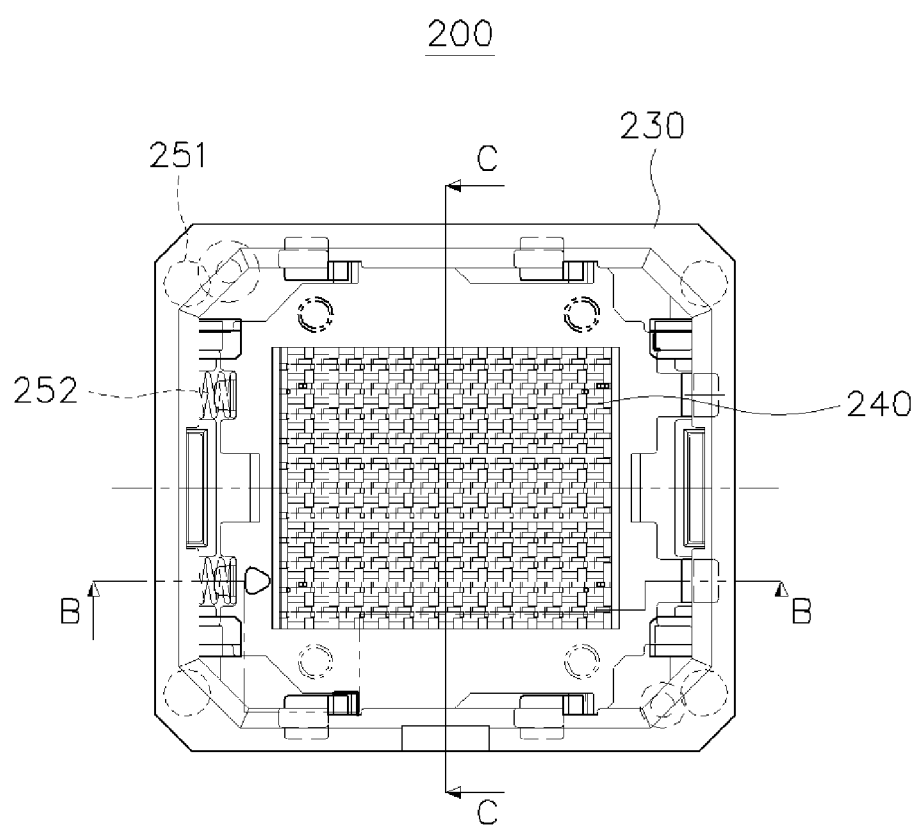
FIG. 6 is a plan view illustrating a BGA socket device according to an embodiment of the present invention.
Figure 7:
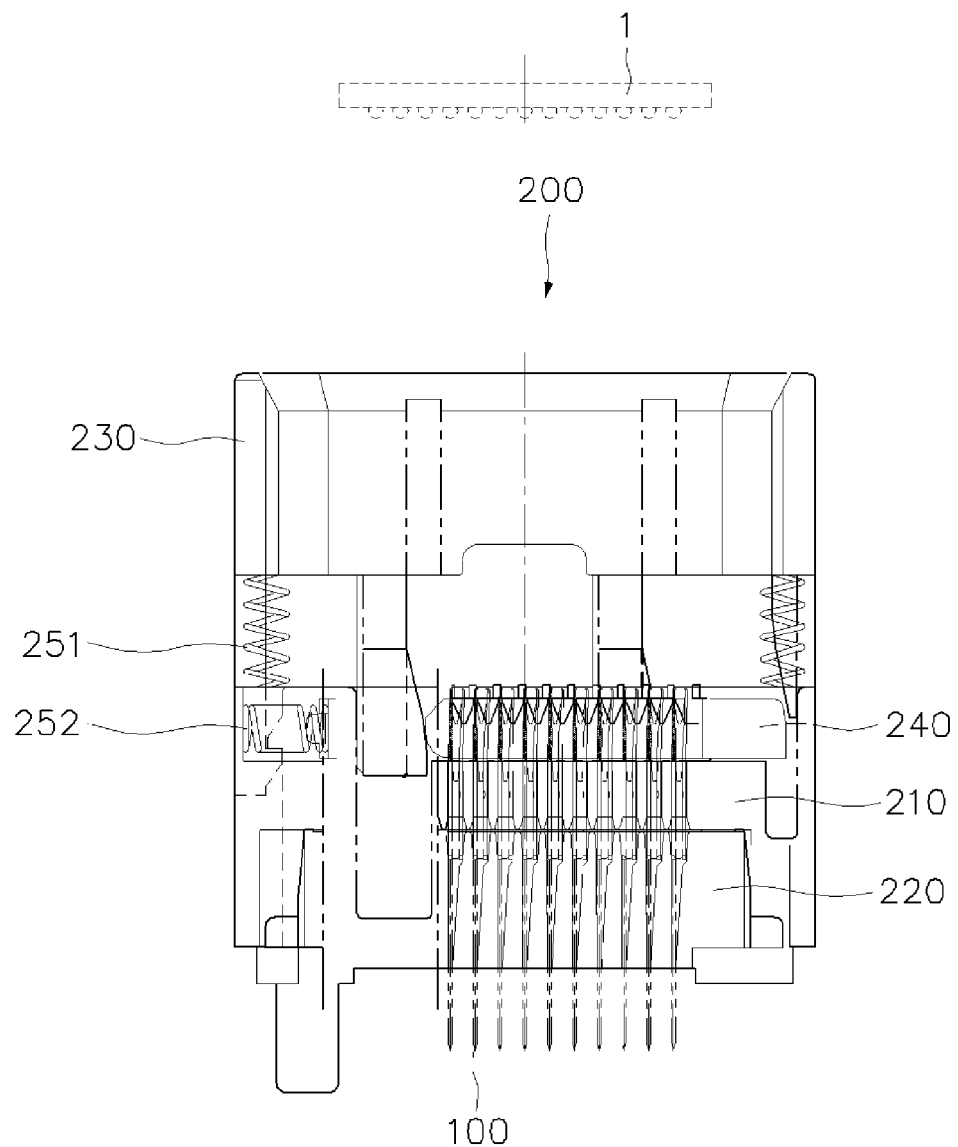
FIG. 7 is a cross-sectional view taken along line B-B in FIG. 6.
Figure 8:
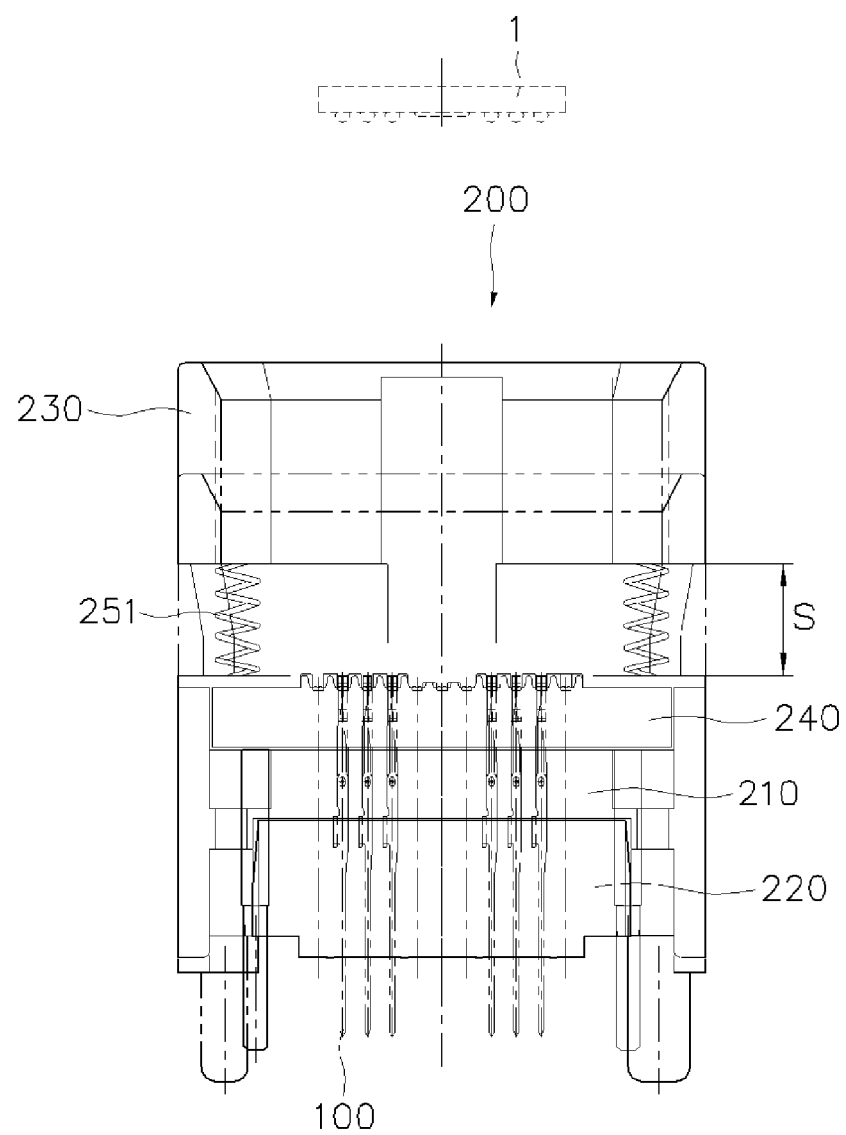
FIG. 8 is a cross-sectional view taken along line C-C in FIG. 6.

FIG. 6 is a plan view illustrating a BGA socket device according to an embodiment of the present invention, FIG. 7 is a cross-sectional view taken along line B-B in FIG. 6, and FIG. 8 is a cross-sectional view taken along line C-C in FIG. 6.

Referring to FIGS. 6 to 8, a BGA socket device 200 according to the present embodiment includes: a contact 100 including a fixed terminal 110 and a movable terminal 120; a main body 210 in which multiple contacts 100 are vertically provided; a stopper body 220 provided on a lower surface of the main body 210 and in which the contacts 100 are fixed; a cover 230 elastically supported on the upper surface of the main body 210 and configured to be movable up and down within a predetermined height range relative to the main body 210; and a slider 240 provided between the main body 210 and the cover 230 and configured to slide left and right in cooperation with an up-and-down movement of the cover 230, thus opening and closing the movable terminal 120 of each of the contacts 100.

Multiple cover springs 251 are provided between the main body 210 and the cover 230. The cover 230 is assembled such that the cover is elastically supported by the cover springs 251 so as to be movable over the main body 210 up and down within a predetermined height S.

Multiple slide springs 252 are provided between the main body 210 and the slider 240 in a horizontal direction. The slide springs 252 bias press the slider 240 in the horizontal direction to provide an operating force for horizontal operation of the slider 240. For reference, the slide springs 252 in the BGA socket device of FIG. 6 bias press the slider 240 right.

Figure 9A:
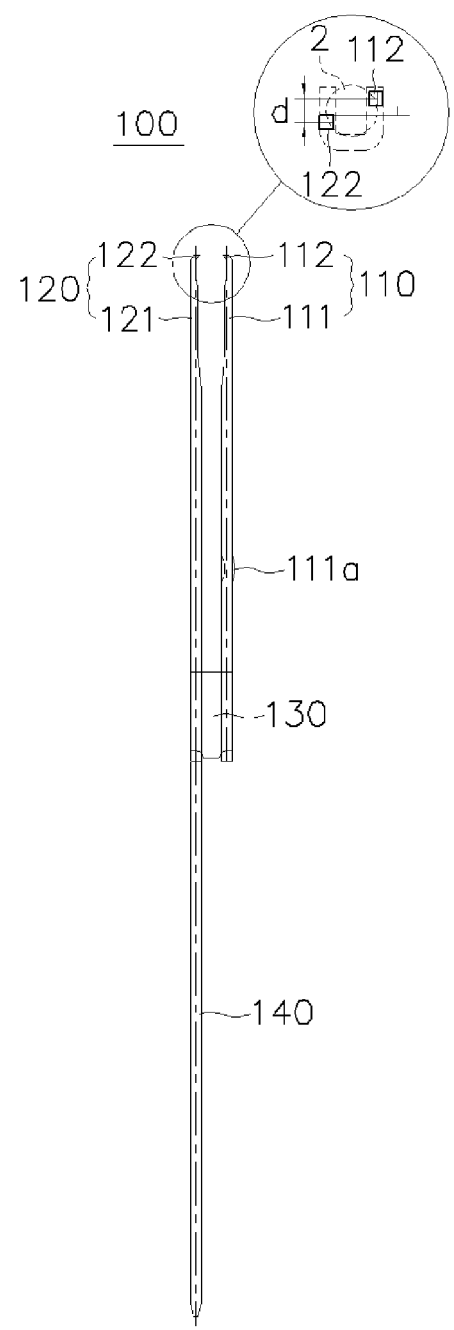
FIGS. 9A and 9B are a front view and a side view and side view, respectively, illustrating a contact according to the embodiment of the present invention.
Figure 9B:
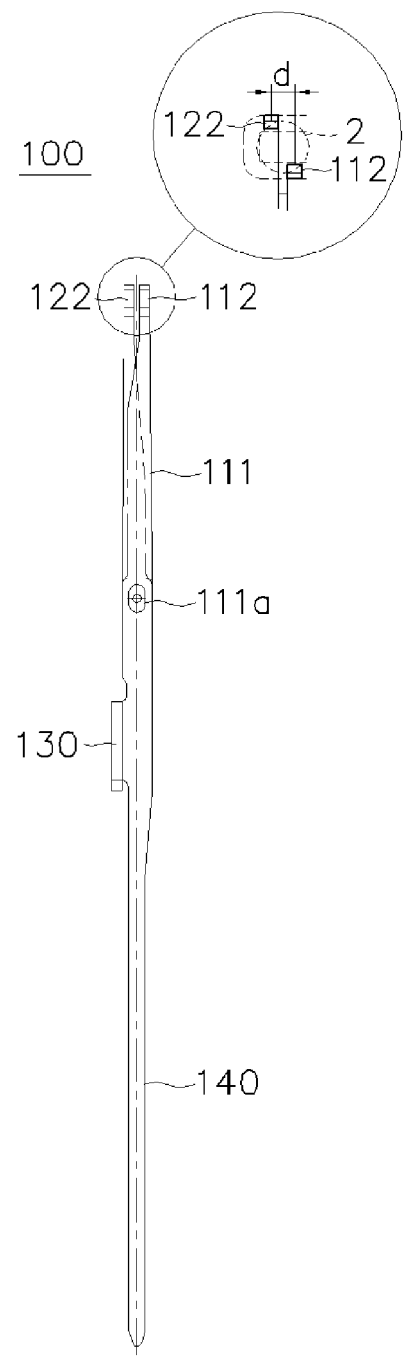

FIGS. 9A and 9B are a front view and a side view and side view, respectively, illustrating a contact according to the embodiment of the present invention.

Referring to FIGS. 9A and 9B, each of the contacts 100 according to the present embodiment is a dual pinch type contact, including the fixed terminal 110 and the movable terminal 120 that are disposed so as to face each other with each solder ball 2 of the IC interposed therebetween. The contact 100 includes a contact body 130 to which lower ends of the fixed and movable terminals 110 and 120 are integrally fixed, and a lead 140 extending down from the contact body 130. The lead 140 is assembled to a through hole of a printed circuit board (PCB, not shown) and fixed by soldering The fixed terminal 110 includes a fixed pin 111 and a fixed upper end 112 provided at an upper end of the fixed pin 111 and coming into direct contact with the solder ball 2 of the IC. Similarly, the movable terminal 120 includes a movable pin 121 and a movable upper end 122 provided at an upper end of the movable pin 121.

The fixed pin 111 may be provided with a support protrusion 111a protruding outward from a middle portion thereof. The support protrusion 111a functions to support the fixed terminal 110 in the horizontal direction when located in a receiving hole of the main body by being supported on an inner surface thereof.

It is preferable that the fixed upper end 112 and the movable upper end 122 are offset from each other by a predetermined distance d with respect to the solder ball 2. Therefore, in the dual pinch type contact according to the present invention, the contact between the contact 100 and the solder ball 2 is made such that the two upper ends 112 and 122 of the contact 100 are offset from each other by the predetermined distance d with respect to the solder ball 2.

Figure 10:
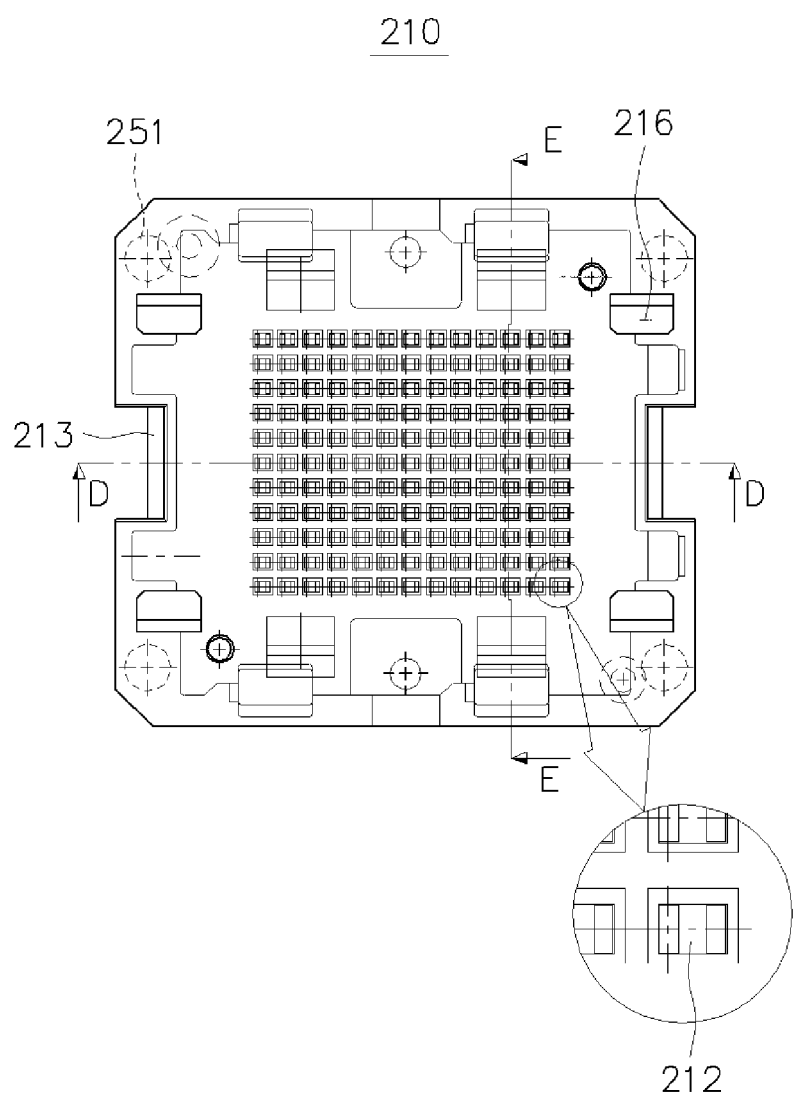
FIG. 10 is a plan view illustrating a main body according to the embodiment of the present invention.
Figure 11:
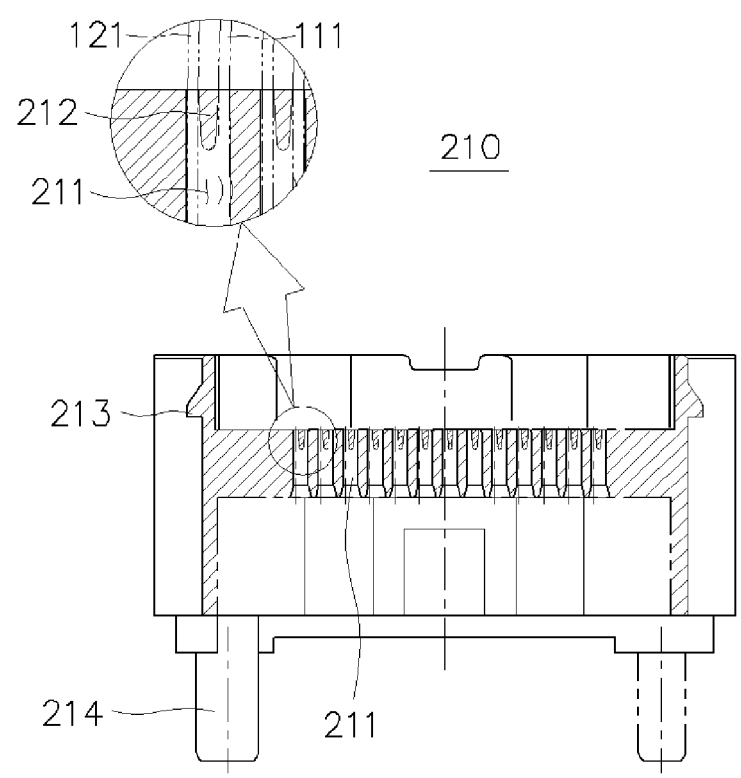
FIG. 11 is a cross-sectional view taken along line D-D in FIG. 10.
Figure 12:
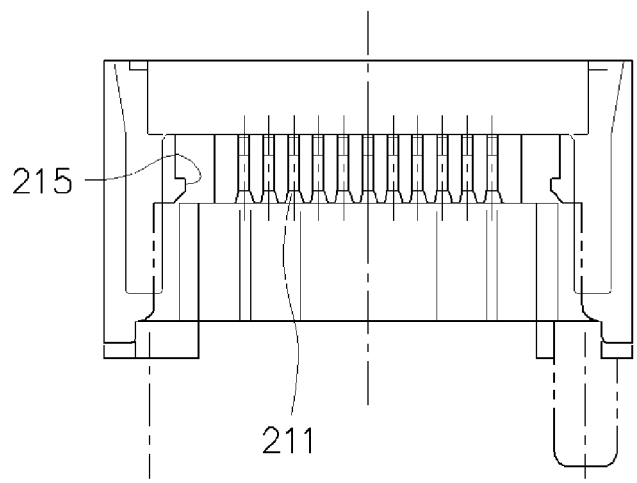
FIG. 12 is a cross-sectional view taken along line E-E in FIG. 10.

FIG. 10 is a plan view illustrating a main body according to the embodiment of the present invention, FIG. 11 is a cross-sectional view taken along line D-D in FIG. 10, and FIG. 12 is a cross-sectional view taken along line E-E in FIG. 10.

Referring to FIGS. 10 to 12, the main body 210 has multiple first receiving holes 211 formed vertically therethrough in a predetermined pattern such that the contacts are vertically received in the respective first receiving holes 211. Each of the receiving holes 211 has a fixed piece 212 provided at an upper open end thereof between the fixed pin 111 and the movable pin 121 such that the fixed pin 111 and the movable pin 121 are fixed horizontally in the main body 210.

The main body 210 has a pair of stopper protrusions 213 symmetrically provided on opposite side walls thereof. The stopper protrusions 213 protrude from the main body 210 at a predetermined height and are engaged with guide protrusions of the cover 210 to limit an up-and-down movement range of the cover 230.

The main body 210 has a guide pin 210 protruding from a lower portion thereof. The guide pin 210 guides a mounting position with respect to the PCB during assembly with the PCB. One or multiple guide pins 214 may be provided.

The main body 210 has first locking protrusions 215 partially protruding from the inner surface of the main body 210. The first locking protrusions 215 are used as assembling members for fitting assembly with the stopper body 220.

Reference numeral 216 denotes slider assembly holes formed vertically through the main body 210 such that the slider 240 is assembled with the main body 210.

Figure 13:
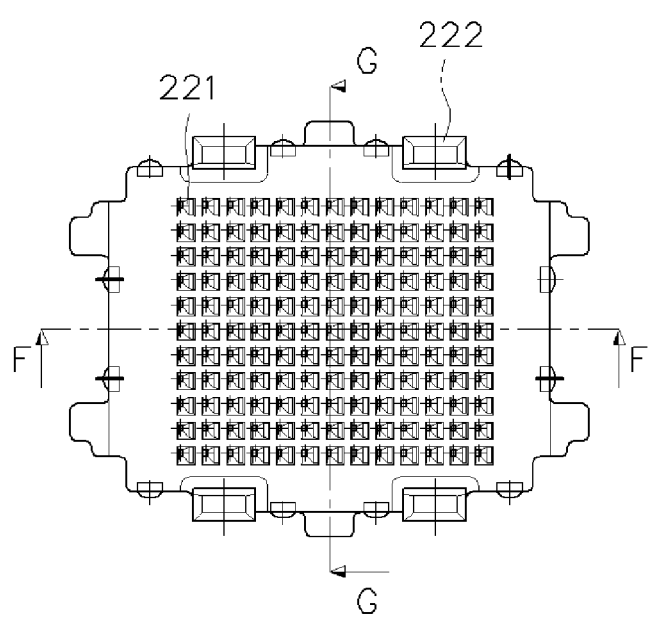
FIG. 13 is a plan view illustrating a stopper body according to the embodiment of the present invention.
Figure 14A:
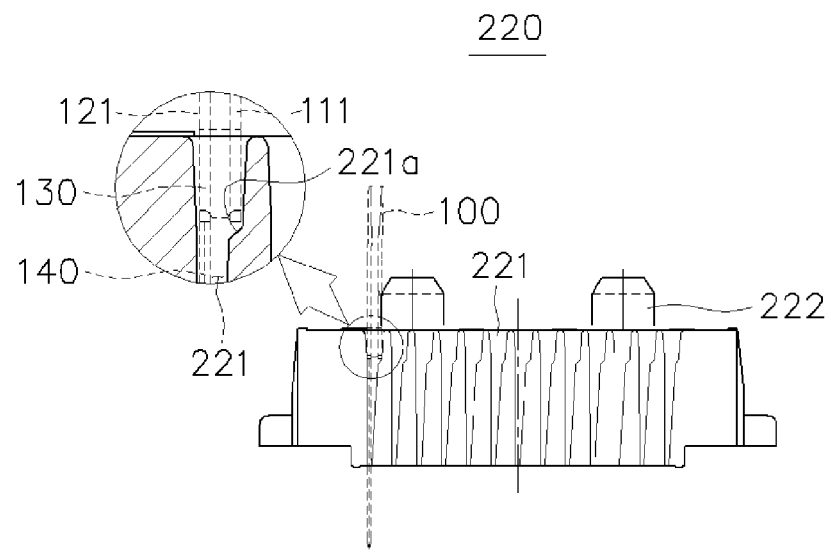
FIGS. 14A and 14B are cross-sectional views taken along line F-F and line G-G in FIG. 13, respectively.
Figure 14B:
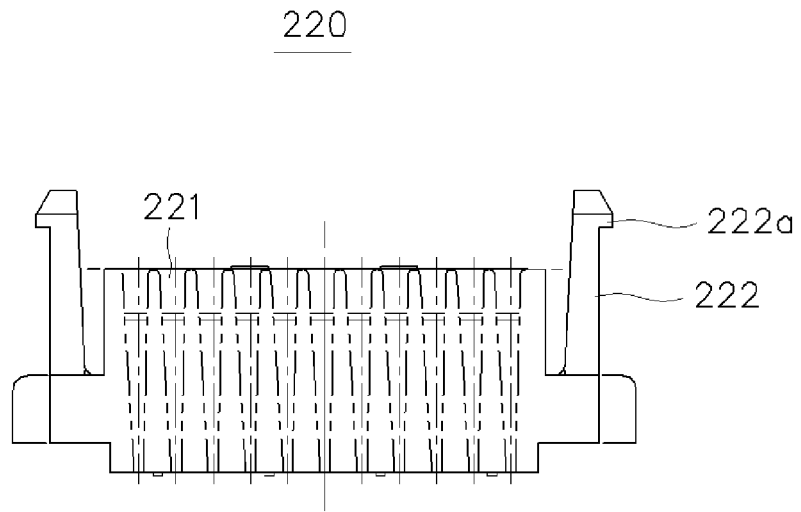

FIG. 13 is a plan view illustrating a stopper body according to the embodiment of the present invention, and FIGS. 14A and 14B are cross-sectional views taken along line F-F and line G-G in FIG. 13, respectively.

Referring to FIGS. 13, 14A, and 14B, the stopper body 220 has multiple second receiving holes 221 formed vertically therethrough in a predetermined pattern, and the contacts 100 are vertically fixed in the respective second receiving holes 221. The second receiving holes 221 are provided at substantially the same locations as the first receiving holes of the main body such that the contacts 100 are vertically located.

It is preferable that each of the second receiving holes 221 is configured such that the inner diameter thereof decreases down, and an inclined support surface 221a having a predetermined inclination is provided on an inner surface thereof. The contact body 130 is supported by the inclined support surface 221a while the lead 140 protrudes down from the second receiving hole 221.

The stopper body 220 has multiple locking arms 222 extending vertically. Each of the locking arms 222 has a second locking protrusion 222a provided at an upper end of thereof. The second locking protrusions 222a are fitted to the first locking protrusions 215 (see FIG. 12) of the main body 210, whereby the stopper body 220 is fitted to the lower surface of the main body 210.

The stopper body 220 is for fixing the contacts 100 together with the main body 210. The contacts 100 are temporarily assembled to the second receiving holes 221 of the stopper body 220 and then are assembled to the main body 210. On the other hand, in another modification, the contacts may be directly press-fitted into the receiving holes of the main body, such that the contacts are fixed only by the main body without provision of the stopper body.

Figure 15:
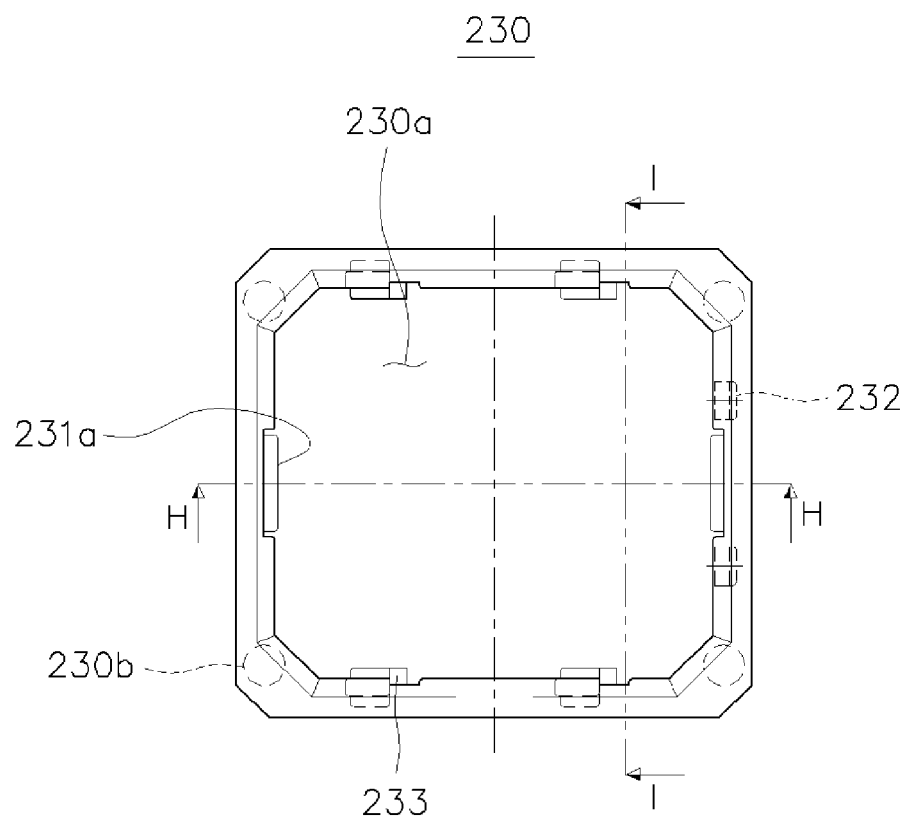
FIG. 15 is a plan view illustrating a cover according to the embodiment of the present invention.
Figure 16:
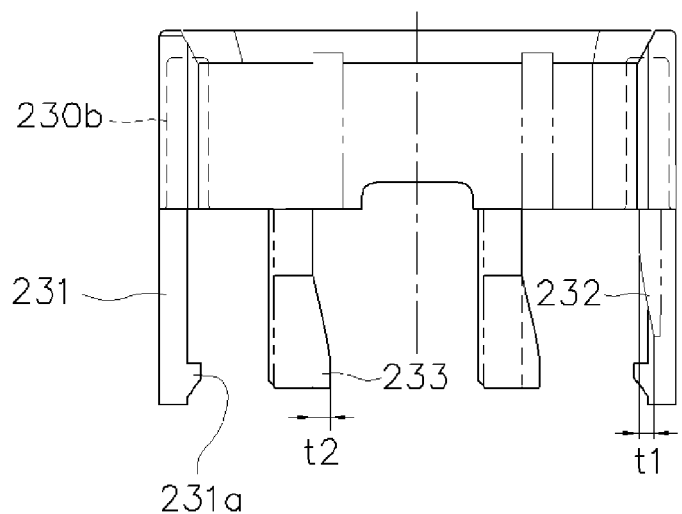
FIG. 16 is a cross-sectional view taken along line H-H in FIG. 15.
Figure 17:
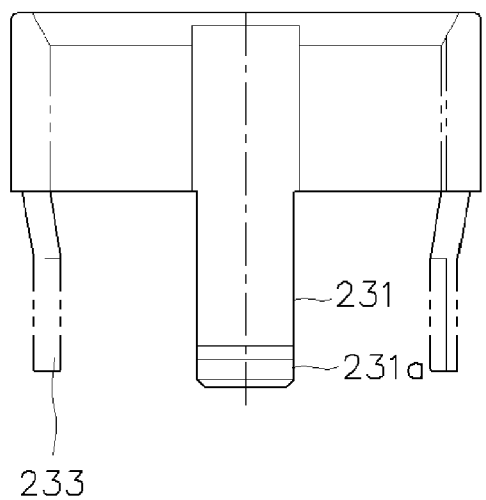
FIG. 17 is a cross-sectional view taken along line I-I in FIG. 15.

FIG. 15 is a plan view illustrating a cover according to the embodiment of the present invention, FIG. 16 is a cross-sectional view taken along line H-H in FIG. 15, and FIG. 17 is a cross-sectional view taken along line I-I in FIG. 15.

Referring to FIGS. 15 to 17, the cover 230 has a substantially rectangular opening 230a formed such that the slider 240 assembled with the main body 210 is exposed, and a cover spring receiving hole 230b formed at each corner thereof. The cover springs 251 are inserted into the cover spring receiving holes 230b such that cover 230 is elastically assembled with the main body 210.

The cover 230 has a pair of guide arms 231 extending down from a lower surface thereof, and a guide protrusion 231a protruding from a lower end of each of the guide arms 231. The guide protrusions 231a are fitted to the stopper protrusions 213 (see FIG. 11) of the main body 210 such that the cover 230 is movable up and down over the main body 210 within a predetermined height range.

The cover 230 has an opening cam 232 and a closing cam 233 that are vertically extending and are configured to slidably move the slider 240 in the horizontal direction.

It is preferable that the opening cam 232 is provided a side of four sides of the cover 230, and the closing cam 233 is provided a side of two sides which are located at a right angle to the opening cam 232. In the present embodiment, the closing cam 233 is provided on both the two sides located at a right angle to the opening cam 232, whereby a horizontal operating force is uniformly transmitted in a sliding direction of the slider 240. It is more preferable that the opening cam 232 is disposed on a side of the four sides of the cover 230, the side being located in a moving direction of the cover 230 (a left-and-right direction in FIG. 6).

Each of the opening cam 232 and the closing cam 233 has an inclined surface, and the respective inclined surfaces are formed within predetermined horizontal lengths t1 and t2. The inclined surfaces function to move the slider 240 in the horizontal direction by coming into contact with the slider 240 when the cover 230 is moved in a vertical direction, which will be described in detail again in the related drawings.

Figure 18:
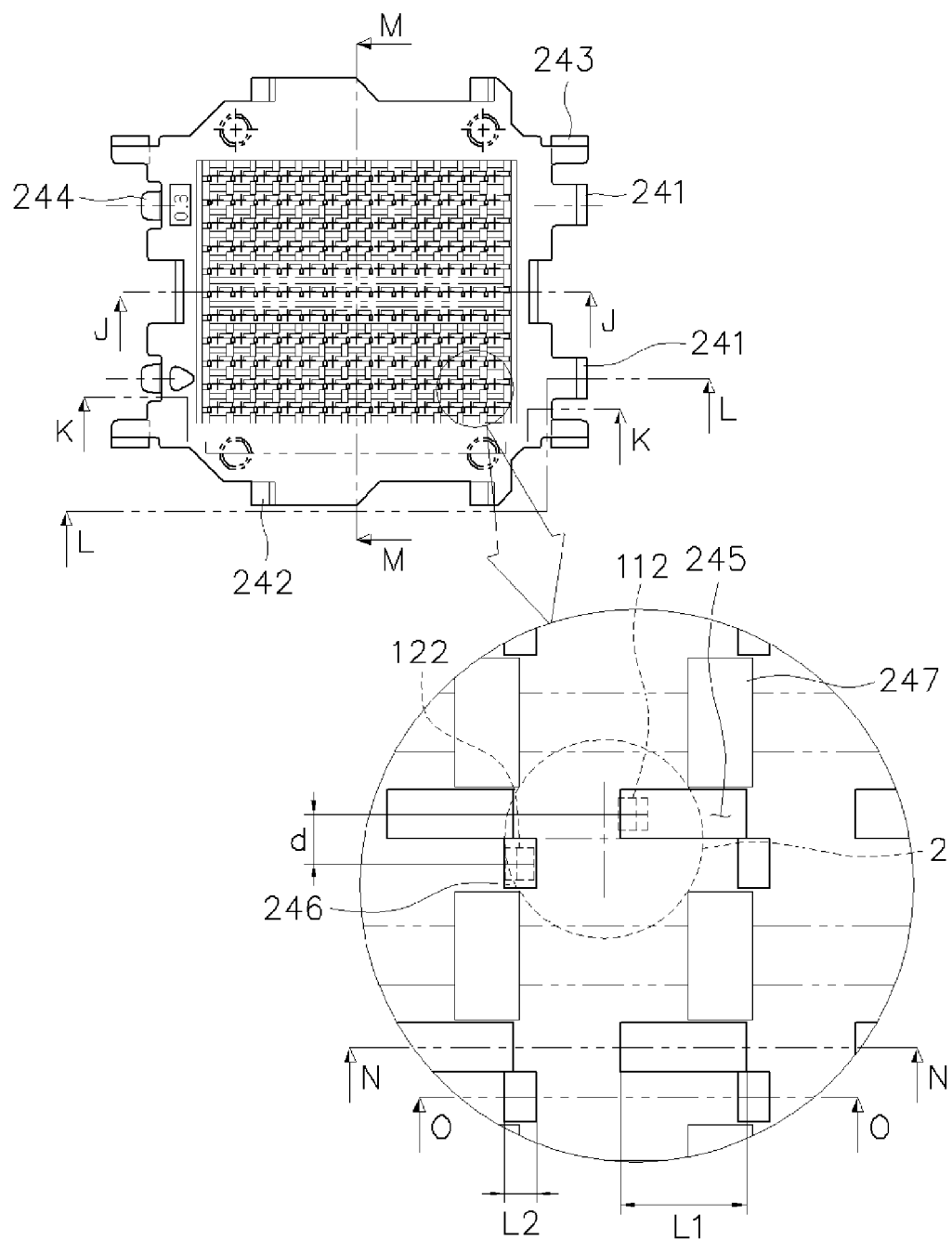
FIG. 18 is a plan view illustrating a slider according to the embodiment of the present invention.
Figure 19A:
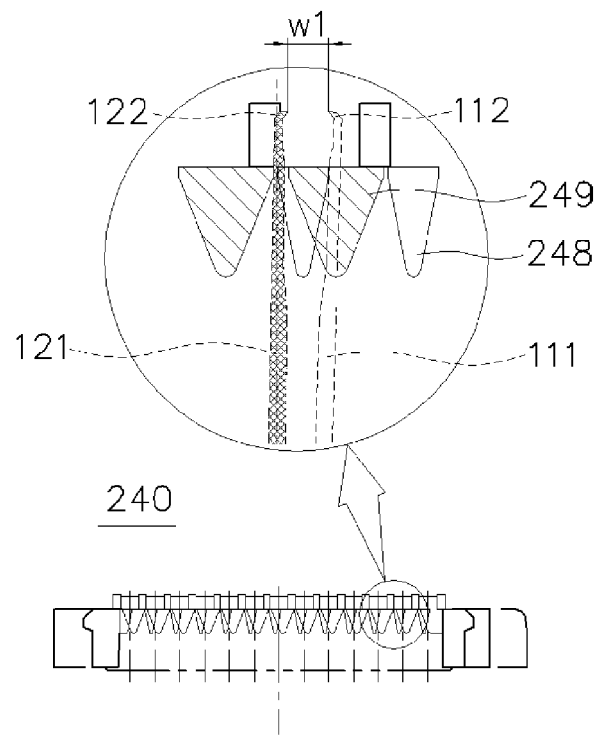
FIGS. 19A, 19B, and 19C are cross-sectional views taken along line J-J, line K-K, and line L-L of FIG. 18, respectively.
Figure 19B:
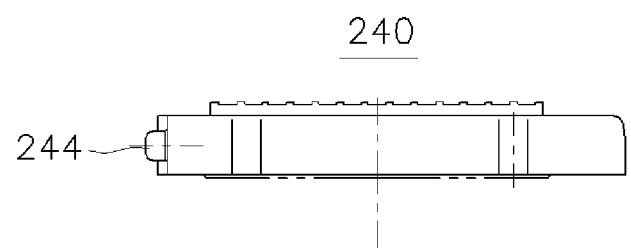
Figure 19C:
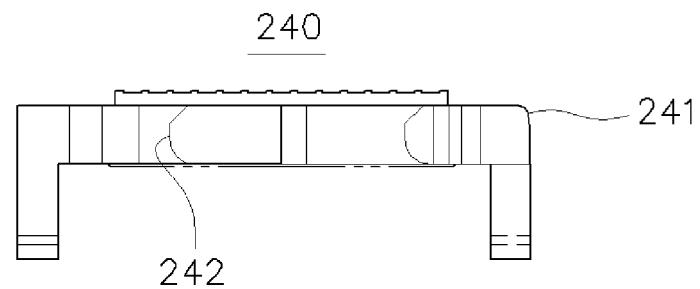
Figure 20A:
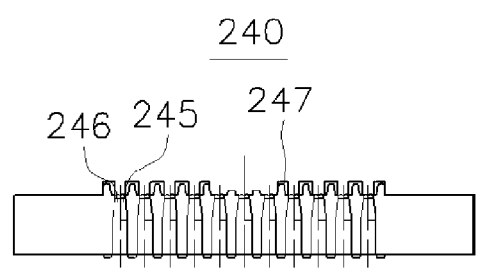
FIGS. 20A and 20B are a cross-sectional view taken along line M-M in FIG. 18 and a right-side view, respectively.
Figure 20B:
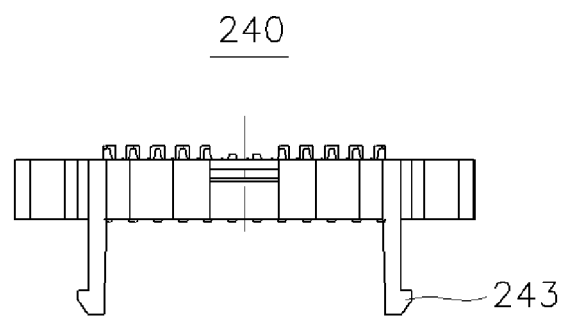
Figure 21A:
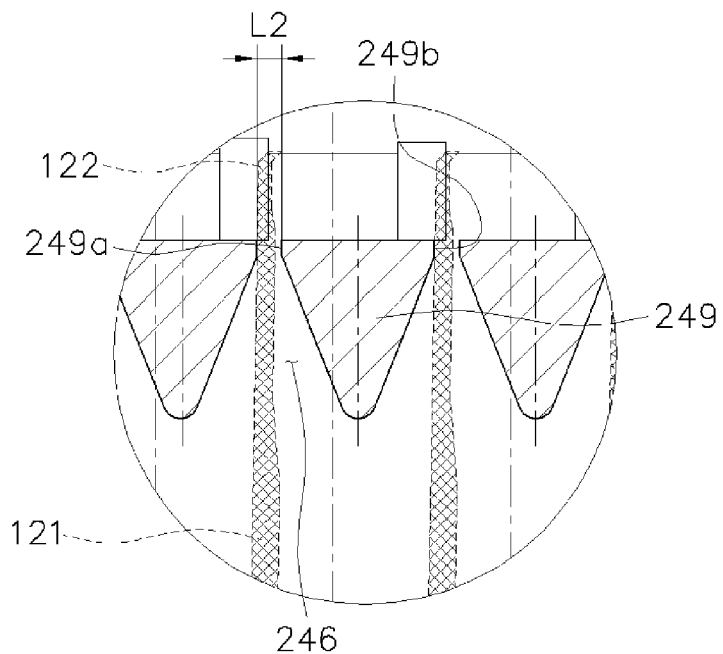
FIGS. 21A and 21B are cross-sectional views taken along line N-N and line O-O in FIG. 18, respectively.
Figure 21B:
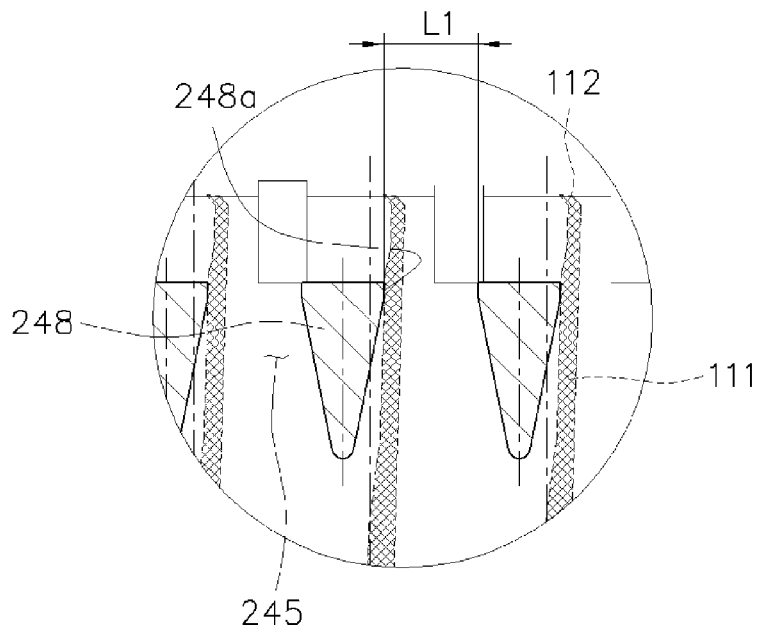

FIG. 18 is a plan view illustrating a slider according to the embodiment of the present invention, FIGS. 19A, 19B, and 19C are cross-sectional views taken along line J-J, line K-K, and line L-L of FIG. 18, respectively, FIGS. 20A and 20B are a cross-sectional view taken along line M-M in FIG. 18 and a right-side view, respectively, and FIGS. 21A and 21B are cross-sectional views taken along line N-N and line O-O in FIG. 18, respectively.

Referring to FIGS. 18 to 21B, the slider 240 has an opening cam contact portion 241 and a closing cam contact portion 242 provided correspondingly to the opening cam 232 and the closing cam 233 of the cover 230 described above. The respective contact portions 241 and 242 integrally protrude from the sides of the slider 240 and have curved surfaces. The contact portions 241 and 242 come into contact with the inclined surfaces of the opening and closing cams 232 and 233 of the cover 230 such that the slider 240 is operated in the horizontal direction in cooperation with the up-and-down movement of the cover 230.

Reference numeral 243 denotes main body assembly hooks, which are fitted into the slider assembly holes 216 (see FIG. 10) of the main body and function to guide a horizontal movement of the slider 240 in the sliding direction. Reference numeral 244 denotes slide spring assembly guides to which the slide springs 252 (see FIG. 6) are fixed.

The slider 240 has a fixed terminal receiving hole 245 and a movable terminal receiving hole 246 in which the fixed and movable pins of each of the contacts 100 are received, respectively, by passing therethrough. It is preferable that the fixed terminal receiving hole 245 and the movable terminal receiving hole 246 are offset from each other by a predetermined distance d, and a length L1 of the fixed terminal receiving hole 245 is longer than a length L2 of the movable terminal receiving hole 246 (L1>L2).

The slider 240 has a solder ball guide 247 provided on an upper surface thereof and guiding a seat position of the solder ball 2 in the process of loading the IC. In the present embodiment, the solder ball guide 247 is provided as multiple blocks arranged equidistantly from a seat center of the solder ball 2, but are not limited thereto.

It is preferable that an opening/closing movable piece 249 protruding in an inverted triangular shape in cross-section is provided between neighboring movable terminal receiving holes 246. The opening/closing movable piece 249 having an inverted triangular shape in cross-section is configured such that left and right ends thereof function as an opening pressure end 249a and a closing pressure end 249b, respectively, with respect to two neighboring movable pins 121.

Furthermore, a distance maintaining movable piece 248 protruding in an inverted triangular shape in cross-section is provided between neighboring fixed terminal receiving holes 245. The distance maintaining movable piece 248 functions to support an inner surface of the fixed pin 111, thus maintaining a minimum distance between the fixed upper end 112 and the movable upper end 122.

Figure 22:
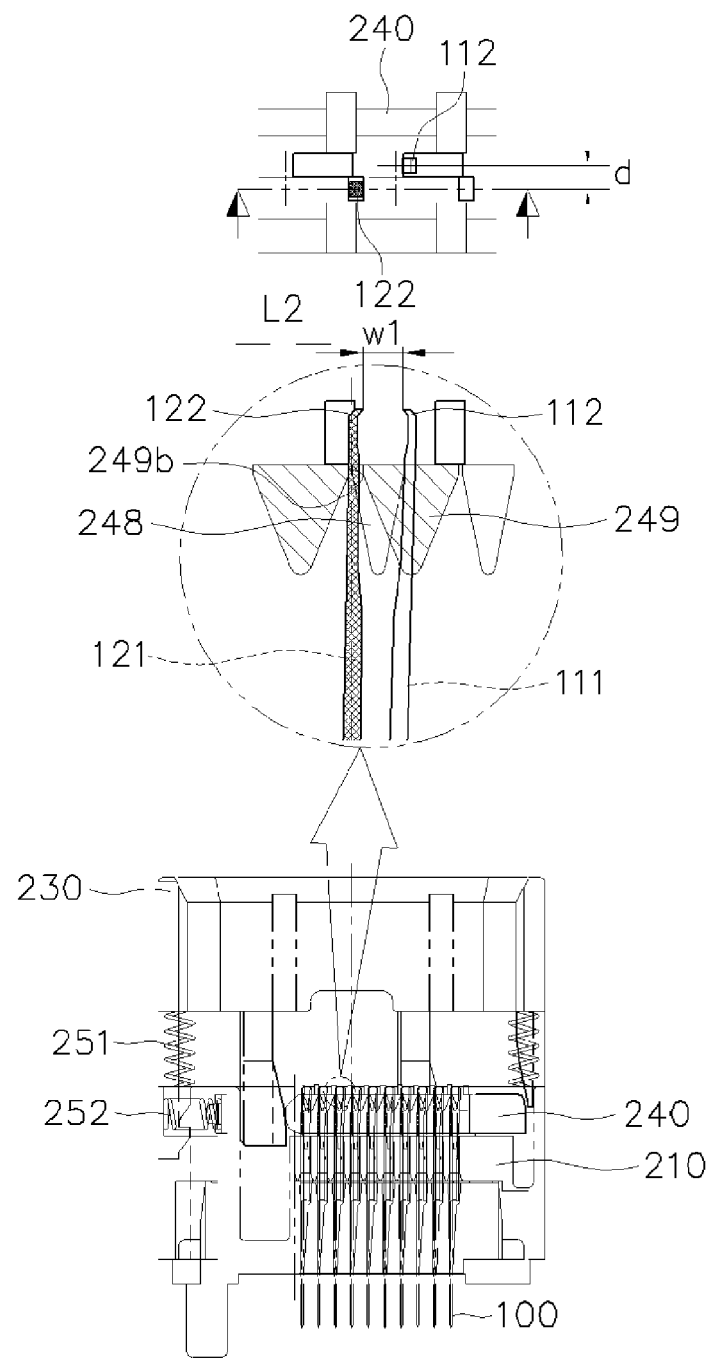
FIGS. 22 to 24 are views illustrating a contact process between a solder ball and a contact of an IC in the BGA socket device according to the embodiment of the present invention.
Figure 23:
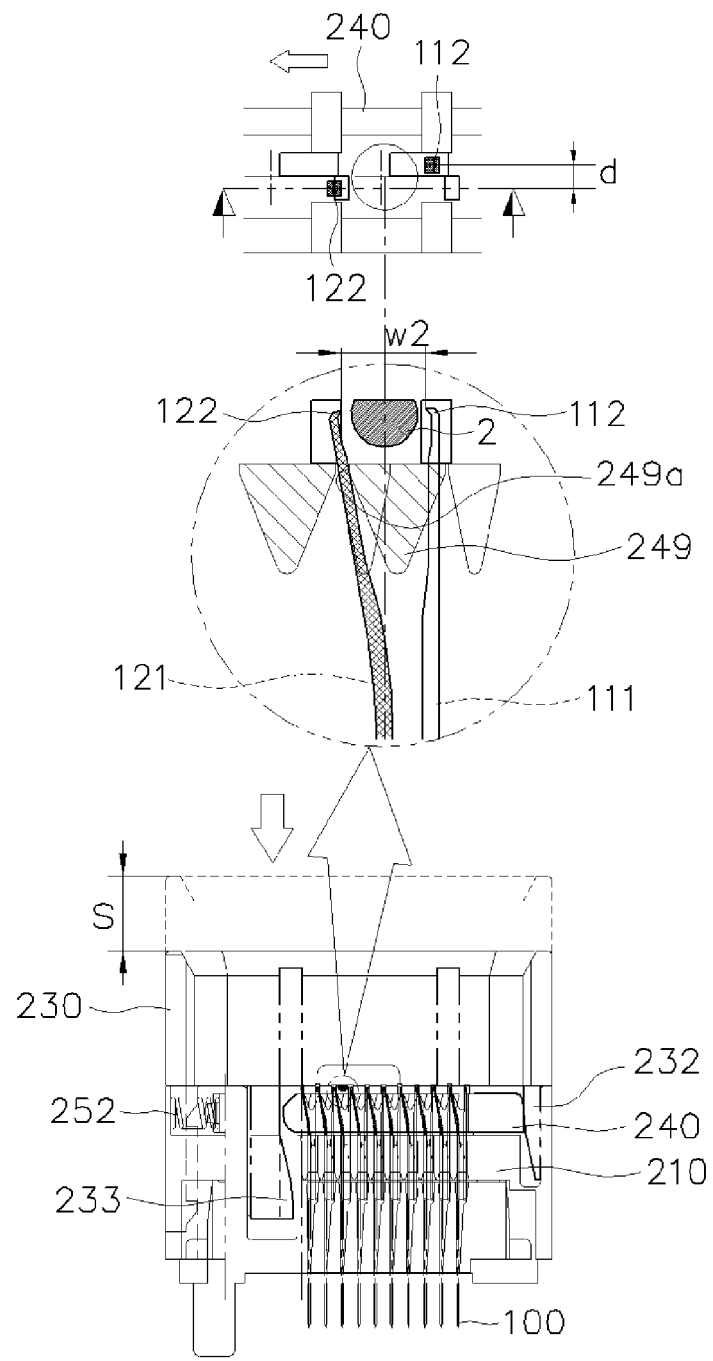
Figure 24:
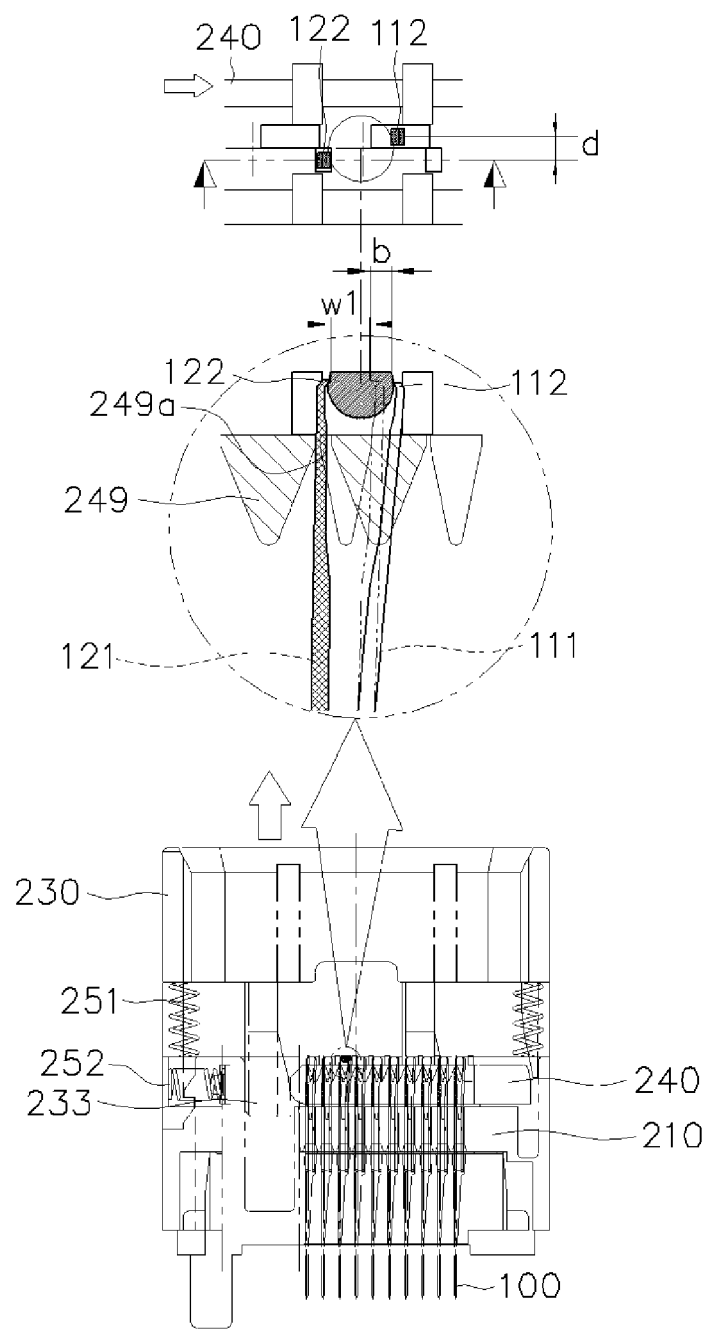

FIGS. 22 to 24 are views illustrating a contact process between a solder ball and a contact of an IC in the BGA socket device according to the embodiment of the present invention.

FIG. 22 illustrates an initial state of the BGA socket device, in which the cover 230 is elastically supported by the cover springs 251 and thus is located at the predetermined height from the upper surface of the main body 210, and the slider 240 is elastically supported by the slide springs 252 and thus is bias pressed to the right side of FIG. 22.

Meanwhile, each of the contacts 100 is in a state where the fixed pin 111 is supported in contact with the distance maintaining movable piece 248 while the contact body 130 is fixed in the main body 210, and the movable pin 121 is supported in contact with the closing pressure end 249b of the opening/closing movable piece 249. Herein, an initial distance w1 between the fixed upper end 112 and the movable upper end 122 is smaller than the diameter of the solder ball 2.

Next, as illustrated in FIG. 23, when the cover 230 is pressed down and moved by a predetermined distance S, the slider 240 is horizontally moved to the left by a predetermined displacement by the opening cam 232 of the cover 230.

The opening/closing movable piece 249 is also horizontally moved in cooperation with the horizontal movement of the slider 240, causing the movable pin 121 to be pushed. At this time, the opening pressure end 249a of the opening/closing movable piece 249 pushes the movable pin 121, causing the two upper ends 112 and 122 to be opened such that a distance w2 therebetween is equal to or greater than the diameter of the solder ball 2. Thereafter, the IC is loaded into the socket device and the solder ball 2 is located between the two upper ends 112 and 122.

Referring to FIG. 24, when an external force acting to press the cover 230 is removed, the cover 230 is returned to an original position thereof by the elastic restoring force of the cover springs 251, and thus the slider 240 is also returned to an original position thereof by the elastic restoring force of the slide springs 252, together with the closing cams 233.

Meanwhile, in the process of returning the slider 240, the movable pin 121 comes into contact with the solder ball 2 in a state of being pressed by the closing pressure end 249b of the opening/closing movable piece 249. Herein, since the initial distance w1 between the two upper ends 112 and 122 is designed to be smaller than the diameter of the solder ball 2 (see FIG. 22), the fixed upper end 112 comes into contact with the solder ball 2 with a contact force due to displacement equal to a distance difference b with respect to the initial state.

Figure 25:
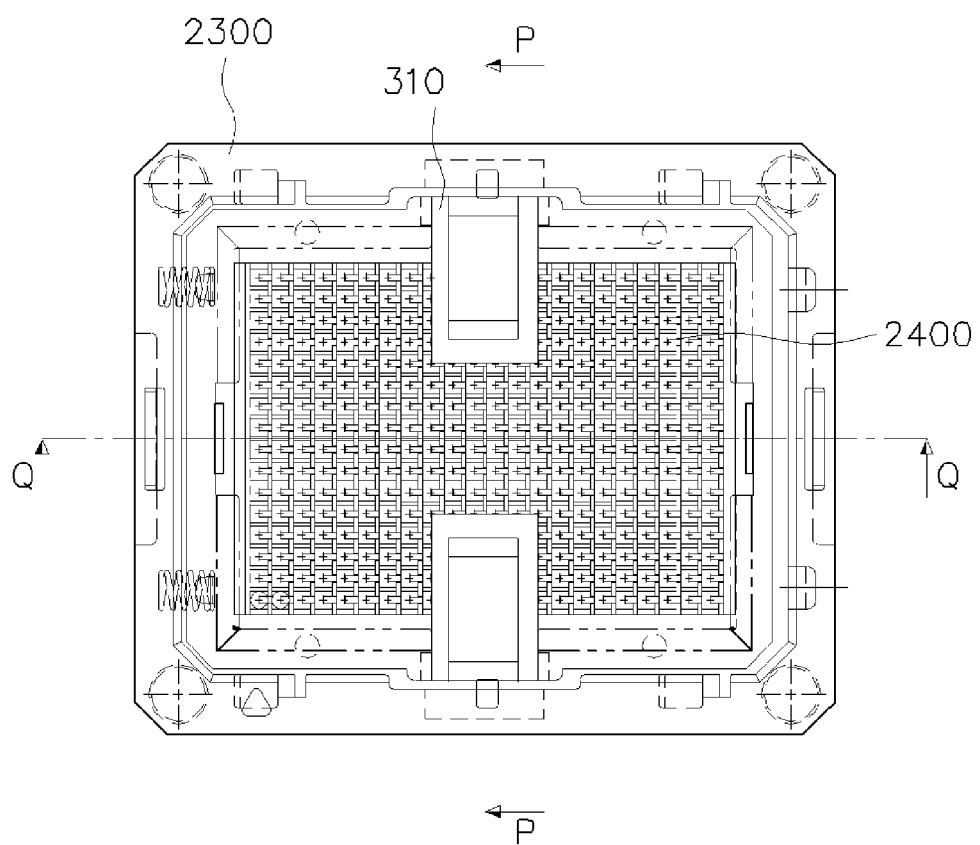
FIG. 25 is a plan view illustrating a BGA socket device according to another embodiment of the present invention.
Figure 26:
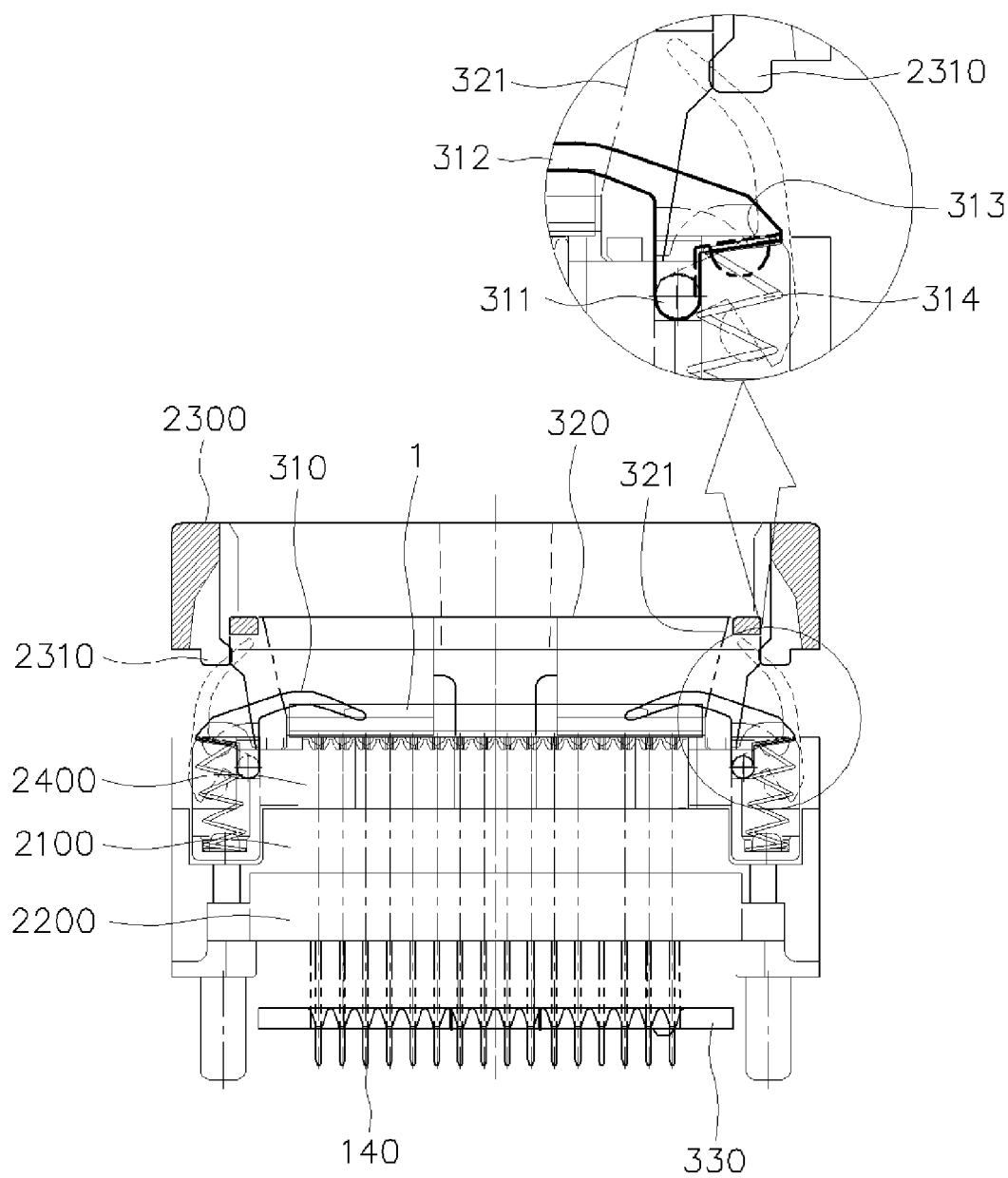
FIG. 26 is a cross-sectional view taken along line P-P in FIG. 25.
Figure 27:
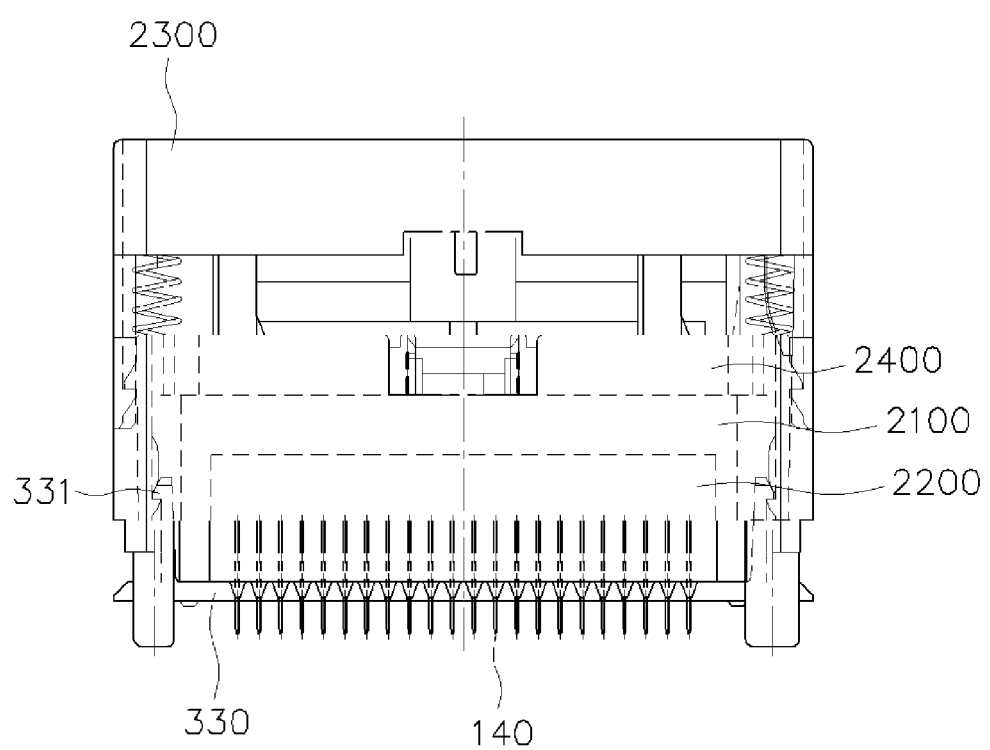
FIG. 27 is a cross-sectional view taken along line Q-Q in FIG. 25.

FIGS. 25 to 27 are views illustrating a BGA socket device according to another embodiment of the present invention, in which FIG. 25 is a plan view, FIG. 26 is a cross-sectional view taken along line P-P in FIG. 25, and FIG. 27 is a cross-sectional view taken along line Q-Q in FIG. 25. The present embodiment remains the same as the previous embodiment in that the contact between a contact and a solder ball is made by a sliding operation of a slider operated in cooperation with a cover. Therefore, a description overlapping with the previous embodiment will be omitted and differences will be mainly described.

The BGA socket device of the present embodiment further includes an IC holder 310 rotatably assembled to a slider 2400 and configured to press an upper surface of an IC 1 in cooperation with an up-and-down movement of a cover 2300.

The IC holder 310 includes: a hinge shaft 311 rotatably assembled to the slider 2400; a pressing lever 312 provided to press the upper surface of the IC 1 with the hinge shaft 311 as a rotary shaft; a bracket 313 eccentrically provided with respect to the hinge shaft 311 within a stroke range of the up-and-down movement of the cover 2300; and a holder spring 314 provided in the slider 2400 and elastically supporting the bracket 313.

The cover 2300 has a pressing protrusion 2310 provided on a lower surface thereof and pressing the bracket 313. When the cover 2300 is lowered, the pressing protrusion 2310 presses the bracket 313, causing the pressing lever 312 to be opened, whereby the IC 1 is loaded or unloaded. In the present embodiment, a pair of IC holders 310 are provided symmetrically at right angles to a sliding direction of the slider 2400 and press the IC 1.

The BGA socket device of the present embodiment further includes an IC guide 320 provided over the slider 2400 and having an inclined surface 321 for guiding the IC 1. The IC guide 320 is supported on the main body 2100 at the lower edge thereof and located over the slider 2400. The IC guide 320 allows the IC 1 to be loaded into the socket device along the inclined surface 321 and seated in a correct position.

The BGA socket device of the present embodiment further includes a lead guide 330 provided under a stopper body 2200 and through which a lead 140 of each contact is inserted.

The lead guide 330 has hooks 331 provided at opposite ends thereof and assembled to the main body 2100 so as to be movable up and down. The lead guide 330 guides the lead 140 such that the lead 140 of the contacts is correctly inserted into a through hole of a PCB in the process of assembling the socket device to the PCB.

Figure 28A:
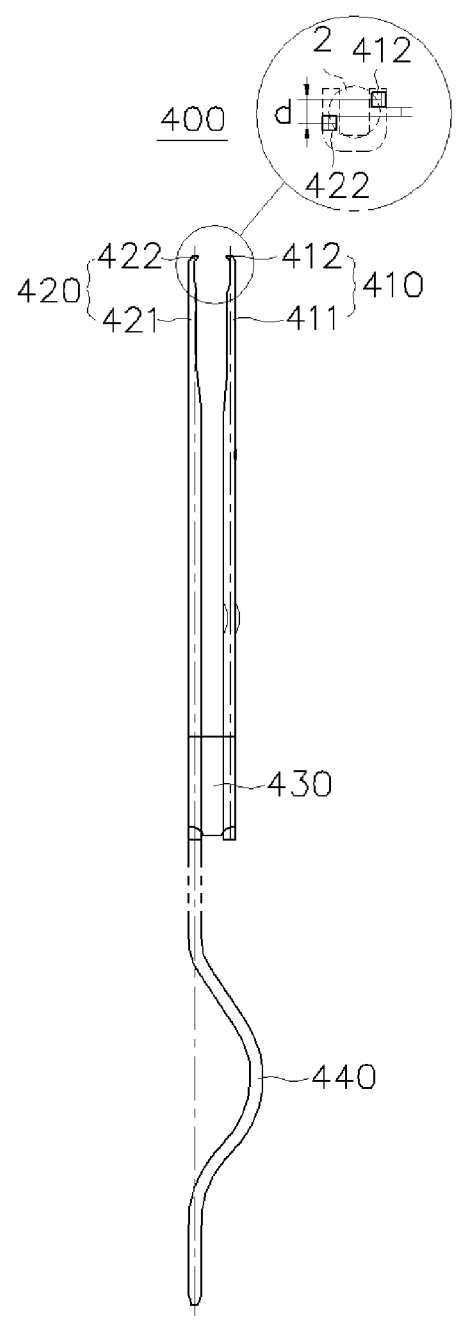
FIGS. 28A and 28B are a front view and a side view, respectively, illustrating a contact according to another embodiment of the present invention.
Figure 28B:
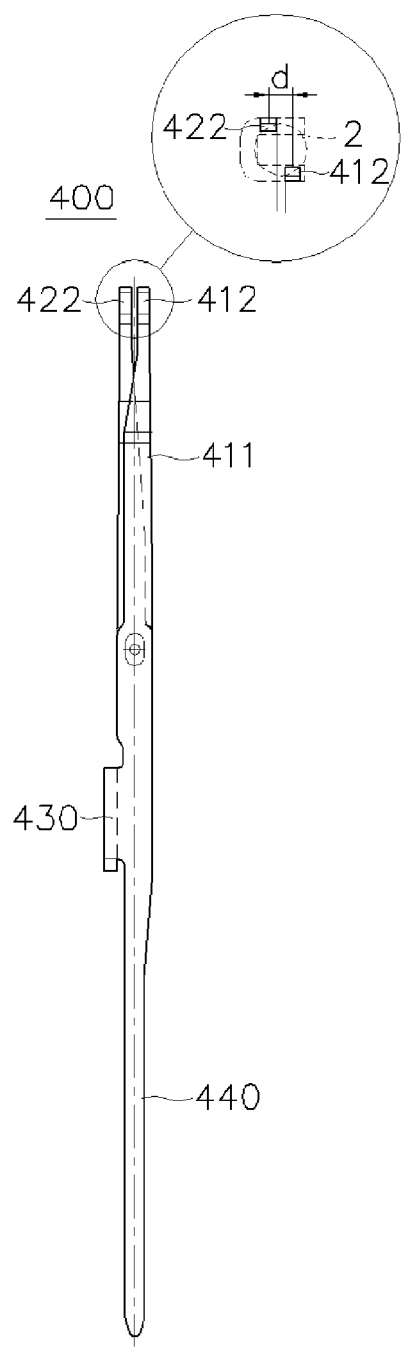

FIGS. 28A and 28B are a front view and a side view, respectively, illustrating a contact according to another embodiment of the present invention.

Referring to FIGS. 28A and 28B, a contact 400 of the present embodiment is a dual pinch type contact, including a fixed terminal 410 and a movable terminal 420. The contact 400 includes a contact body 430 to which lower ends of the fixed and movable terminals 410 and 420 are integrally fixed, and a lead 140 extending down from the contact body 430.

The fixed terminal 410 includes a fixed pin 411, and a fixed upper end 412 provided at an upper end of the fixed pin 411 and coming into direct contact with each solder ball 2 of an IC. The movable terminal 420 also includes a movable pin 421, and a movable upper end 422 provided at an upper end of the movable pin 421.

The fixed upper end 412 and the movable upper end 422 are offset from each other by a predetermined distance d with respect to the solder ball 2.

Particularly, in the present embodiment, the lead 240 has a curved portion. Due to the curved portion of the lead 440, the lead 440 has a predetermined elastic force exerted in an up-and-down direction and comes into contact with a contact pad of the PCB while being compressed, thus increasing a contact force.

Although the invention is described with reference to specific items such as specific structural elements, to merely some embodiments, and to drawings, such specific details disclosed herein are merely representative for purposes of helping more comprehensive understanding of the present invention. The present invention, however, is not limited to only the exemplary embodiments set forth herein, and those skilled in the art will appreciate that the present invention can be embodied in many alternate forms.

What is claimed is:

1. A BGA socket device for testing a BGA IC, the BGA socket device comprising:

contacts each including a fixed terminal and a movable terminal provided so as to face each other, the contact being configured such that respective upper ends of the fixed terminal and the movable terminal are offset from each other by a predetermined distance (d) with respect to each solder ball of the IC;

a main body in which the contacts are vertically provided and fixed;

a cover elastically supported on an upper surface of the main body and configured to be movable up and down within a predetermined height range relative to the main body; and a slider provided between the main body and the cover and configured to slide left and right in cooperation with an up-and-down movement of the cover, thus opening and closing the movable terminal in a horizontal direction, the slider having a fixed terminal receiving hole and a movable terminal receiving hole in which the fixed and movable terminals of the contact are received, respectively, by passing therethrough, wherein the fixed terminal receiving hole and the movable terminal receiving hole are offset from each other by a predetermined distance (d) equal to the distance (d) between the upper ends of the contact, and the fixed terminal receiving hole is longer in length than the movable terminal receiving hole.

2. The BGA socket device of claim 1, further comprising:
a slide spring elastically supporting the slider in a sliding direction.

3. The BGA socket device of claim 1, wherein the cover includes:
an opening cam and a closing cam that extend vertically and are configured to move the slider back and forth in the horizontal direction by coming into contact with an opening cam contact portion and a closing cam contact portion of the slider, respectively, in cooperation with the up-and-down movement of the cover.

4. The BGA socket device of claim 3, wherein the opening cam is provided on a side of four sides of the rectangular cover, and the closing cam is provided on a side of two sides which are located at a right angle to the opening cam.

5. The BGA socket device of claim 4, wherein the opening cam is provided in the sliding direction of the slider.

6. The BGA socket device of claim 1, further comprising:
a solder ball guide provided on an upper surface of the slider and guiding a seat position of the solder ball of the IC.

7. The BGA socket device of claim 6, wherein the solder ball guide is provided as multiple blocks protrudingly arranged equidistantly from a seat center of the solder ball.

8. The BGA socket device of claim 1, wherein the slider includes:
multiple movable terminal receiving holes formed corresponding to the multiple contacts; and
an opening/closing movable piece provided between neighboring movable terminal receiving holes, and having an opening pressure end pressing the movable terminal in an opening direction and a closing pressure end pressing the movable terminal in a closing direction.

9. The BGA socket device of claim 8, wherein the slider further includes:
a distance maintaining movable piece provided between neighboring fixed terminal receiving holes and supporting an inner surface of the fixed terminal so as to maintain a minimum distance between the fixed upper end and the movable upper end.

10. The BGA socket device of claim 9, wherein the minimum distance (w1) between the fixed upper end and the movable upper end is smaller than a diameter of the solder ball.

11. The BGA socket device of claim 1, further comprising:
a stopper body provided on a lower surface of the main body and in which the contact is fixed.

12. The BGA socket device of claim 1, further comprising:
an IC holder rotatably provided on the slider and configured to press an upper surface of the IC in accordance with the up-and-down movement of the cover.

13. The BGA socket device of claim 1, further comprising:
an IC guide provided over the slider and having an inclined surface guiding the IC to be loaded such that the IC is seated in a seat position.

14. The BGA socket device of claim 1, further comprising:
a lead guide provided under the main body so as to be movable up and down and through which the lead of the contact is inserted.

15. The BGA socket device of claim 2, wherein the cover includes:
an opening cam and a closing cam that extend vertically and are configured to move the slider back and forth in the horizontal direction by coming into contact with an opening cam contact portion and a closing cam contact portion of the slider, respectively, in cooperation with the up-and-down movement of the cover.

16. The BGA socket device of claim 15, wherein the opening cam is provided on a side of four sides of the rectangular cover, and the closing cam is provided on a side of two sides which are located at a right angle to the opening cam.

17. The BGA socket device of claim 16, wherein the opening cam is provided in the sliding direction of the slider.

* * * * *